United States Patent [19]

Kitajo

[11] Patent Number: 5,241,452
[45] Date of Patent: Aug. 31, 1993

[54] PACKAGE WITH HEAT SINK

[75] Inventor: Sakae Kitajo, Tokyo, Japan

[73] Assignee: NEC Corporation, Tokyo, Japan

[21] Appl. No.: 943,016

[22] Filed: Sep. 10, 1992

[30] Foreign Application Priority Data

Sep. 13, 1991 [JP] Japan .................. 3-234813

[51] Int. Cl.$^5$ .............................................. H05K 7/20
[52] U.S. Cl. .................................. 361/718; 165/80.3;
165/185; 174/16.3; 257/708; 257/722; 361/690
[58] Field of Search ................. 176/16.3; 165/80.3,
165/179, 182, 185; 257/706, 709, 713–714, 722;
361/383, 384, 386–389

[56] References Cited

U.S. PATENT DOCUMENTS 3,303,392 2/1967 Zelina .................. 165/80.3
3,798,506 3/1974 English ................. 174/16.3
5,130,918 7/1992 Schuster ............... 361/383

Primary Examiner—Gregory D. Thompson
Attorney, Agent, or Firm—Burns, Doane, Swecker & Mathis

[57] ABSTRACT

Disclosed is a heat-sink equipped package in which a heat sink has a plurality of flat plates arranged in a row, and both end plates have a rectangular shape, while those plates located between the end plates are each an inverted trapezoid having the bottom side shorter than the top side. This structure of the heat sink allows air to easily flow through the bottom portions of the plates. The cooling air therefore leaks outside less, and passes through the spacings between the plates, increasing the cooling performance of the heat sink and improving the cooling efficiency of the package.

1 Claim, 2 Drawing Sheets

PACKAGE WITH HEAT SINK

BACKGROUND OF THE INVENTION

1. Field of the Invention

The present invention relates to a semiconductor package with a heat sink, on which a chip such as an IC chip or LSI chip is mounted.

2. Description of the Related Art

Recent high semiconductor device technology as is apparent from theoretical devices, successively reduces the speed and power product per gate, and the development of miniaturization technology gradually reduces the device-occupying area per gate.

The development of semiconductor chips is apt to achieve higher speed and higher integration. The development of packages for protecting semiconductor chips and improving their reliability is now entering in the region of installment in consideration of the art of bonding semiconductor chips.

Accordingly, various types of semiconductor packages to mount LSI semiconductor devices or a high-density and miniaturized LSI chip have gradually been employed in recent computer systems in order to improve the system performance and reliability.

As the degree of the integration of semiconductor devices increases, the power dissipation of a semiconductor chip rises. In this connection, each LSI chip with high power dissipation is mounted in a package made of ceramics having a greater thermal conductivity than plastic. However, the efficiency of heat dissipation by a printed circuit board alone to cool the LSI chip is naturally limited.

Under such circumstance, in a conventional semiconductor package on which the aforementioned high-speed, high-integration LSI chip is to be mounted, from a viewpoint of a cooling effect to the heat generated by the LSI chip, a heat sink made of a material such as aluminum or copper that has high heat dissipation efficiency is secured integrally on the top of the semiconductor package by solder or an adhesive that has high thermal conductivity to discharge the heat effectively.

FIG. 1 is a perspective view illustrating an example of a conventional heat-sink equipped package, and FIG. 2 is a vertical cross-sectional view of the same. In these diagrams, reference numeral "1" is a case, reference numeral "5" denotes pins and reference numeral "7" is a heat sink.

A chip-mount plate 2 of a material having good thermal conductivity is adhered to the top surface of the case 1. A chip 3 is mounted on the bottom surface of the chip-mount plate 2 by a chip adhesion agent.

The chip 3 is connected to wirings on the case 1 by wiring members 4. A plurality of pins 5 are provided on the bottom surface of the case 1. A cap 6 is adhered to the bottom surface of the case 1 to cover the chip 3, keeping the interior of the case 1 airtight.

The heat sink 7 is adhered to the top of the chip-mount plate 2 by a heat sink adhesion agent. The heat sink 7 has a plurality of rectangular plates of the same shape arranged in a row. Today, packages with such a structure are manufactured.

The heat-sink equipped packages having this structure do not have high heat dissipation efficiency and cannot yield a sufficient cooling effect. This shortcoming leads to a temperature rise of the chip, thus lowering the operation speed of the device.

SUMMARY OF THE INVENTION

It is therefore an object of the present invention to provide a heat-sink equipped package which is very reliable to have a sufficient heat dissipation effect even if a high-integration LSI chip that generates a large amount of heat is mounted in the package.

To achieve this object, according to the present invention, there is provided a heat-sink equipped semiconductor package comprising:
- a case for accommodating a chip;
- a heat sink;
- a cavity for retaining the chip therein;
- a chip-mount plate; and
- a cap
  wherein the cavity is sealed with the chip-mount plate and the cap,
  the chip being securely adhered to the bottom surface of the chip-mount plate,
  the heat sink consisting of a plurality of plates secured and arranged in parallel on the chip-mount plate,
  the outermost plates locating at both ends having a rectangular shape, while each of those plates locating therebetween being of an inversely trapezoidal shape having a bottom side shorter than a top side.

As the degree of the integration of devices increases as in a VLSI, the power dissipation of a semiconductor chip increases. From a viewpoint of a cooling effect to the heat generated by an LSI chip having large power dissipation, a heat sink made of a material such as aluminum or copper that has high heat dissipation efficiency is secured integrally on that surface of the package which is opposite to where the LSI chip is secured, by solder or an adhesive that has high thermal conductivity, thereby allowing the heat to be discharged.

While there are various shapes of heat sinks, the one having a plurality of rectangular plates arranged in a row is employed due to an excellent heat dissipation effect of that heat sink alone.

In the heat-sink equipped package of the present invention, the heat sink has a plurality of flat plates arranged in a row, and both end plates have a rectangular shape, while those plates located between the end plates are each of an inversely trapezoidal shape. The spacings between the plates cause a pressure drop which prevents air from escaping around the heat sink. The amount of air passing through the spacings between the plates is therefore increased, thus improving the heat dissipation efficiency. This structure can accomplish the aforementioned heat-sink equipped package with high heat dissipation.

DETAILED DESCRIPTION OF THE PREFERRED EMBODIMENT

A preferred embodiment of the present invention will now be described referring to the accompanying drawings.

Figure 1:
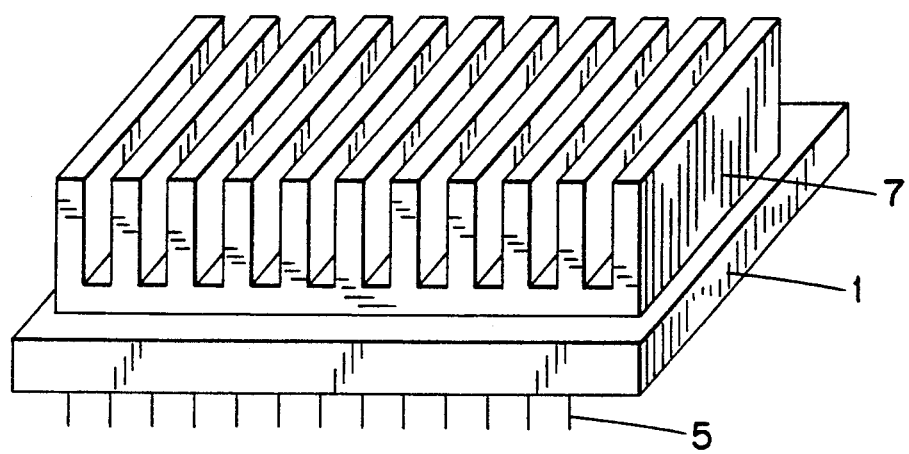
FIG. 1 is a perspective view of a conventional heat-sink equipped package.
Figure 2:
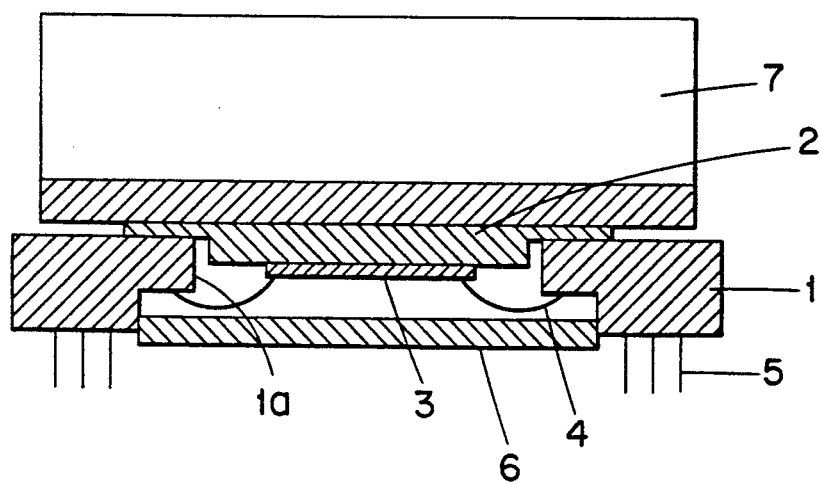
FIG. 2 is a vertical cross section of the conventional heat-sink equipped package.
Figure 3:
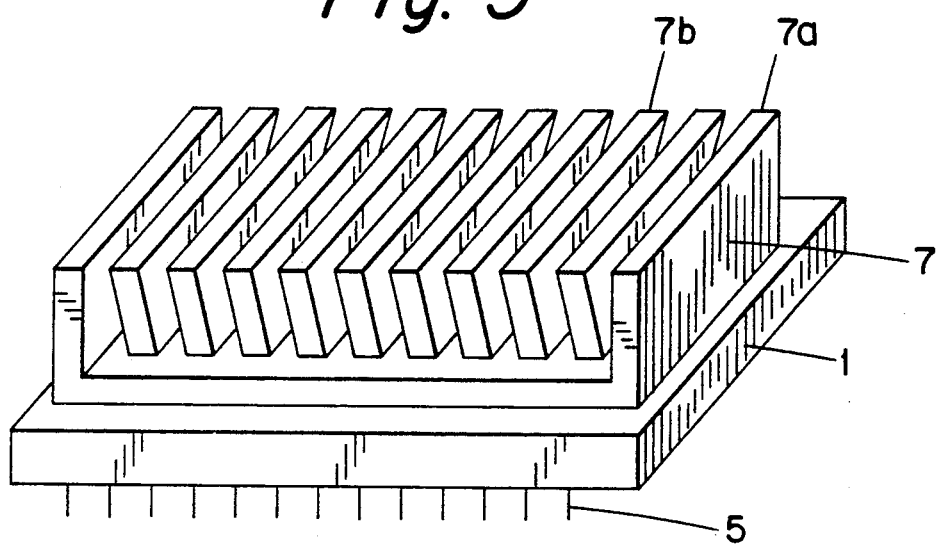
FIG. 3 is a perspective view of a heat-sink equipped package according to one embodiment of the present invention.
Figure 4:
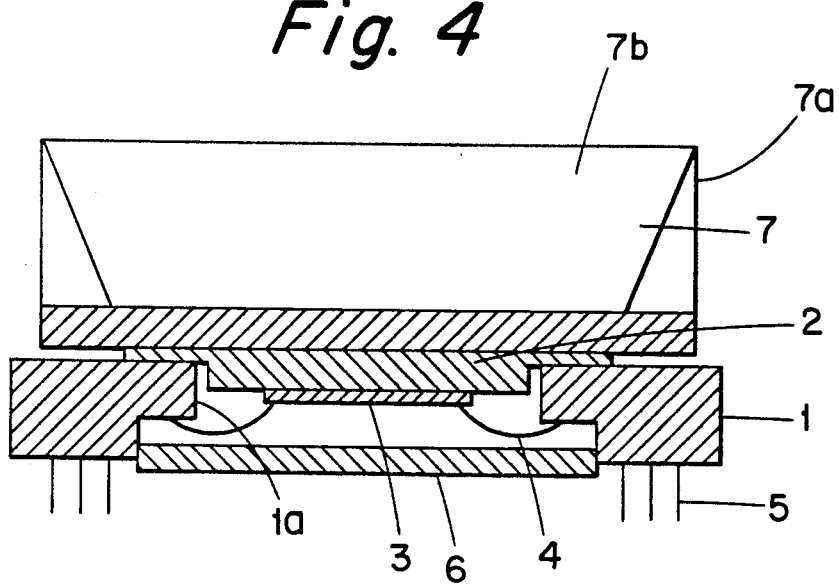
FIG. 4 is a vertical cross section of the heat-sink equipped package according to this embodiment.

FIG. 3 presents a perspective view exemplifying a heat-sink equipped package according to the present invention, and FIG. 4 is a vertical cross section of the same.

Referring to the diagrams, a chip-mount plate 2 is adhered on a flat case 1 of alumina having a cavity 1a formed in the center, so that the chip-mounting portion of the chip-mount plate 2 is fitted in the cavity 1a. A chip 3 is mounted on the bottom of the chip-mount plate 2 by a chip adhesion agent.

A plurality of pins 5 for connecting the chip 3 to a printed circuit board are protrusively provided on the bottom peripheral portion of the case 1. At the peripheral portion of the center cavity 1a of the case 1 is provided a connection pad which connects the pins 5 to the chip 3. The connection pad is electrically connected to the pins 5 via the surface or inner layer of the case 1.

The terminal portions of the chip 3 are connected, by wiring members 4 such as wires, to the connection pad connected to the pins 5. A cap 6 is adhered to the bottom surface of the case 1 to cover the chip 3 by an adhesive such as glass with a low melting point, thereby keeping the interior of the case 1 airtight.

A heat sink 7 of aluminum is adhered to the top surface of the chip-mount plate 2 by a heat sink adhesion agent. The heat sink 7 has a plurality of flat plates 7a and 7b arranged in a row. Both end plates 7a have a rectangular shape while each plate 7b located therebetween is of an inversely trapezoidal shape.

The thermal resistance of a package equipped with a heat sink, which has a plurality of flat plates arranged in a row and whose both end plates have a rectangular shape while each of the inner plates is of an inversely trapezoidal shape, according to the present invention was compared with that of a conventional package equipped with a heat sink which has a plurality of rectangular plates of the same size and same shape arranged in a row.

The package of the present invention yielded a thermal resistance of 2.0 K/W for a wind speed of 5 m/s, whereas the conventional package yielded a thermal resistance of 2.6 K/W for the same wind speed of 5 m/s.

It is apparent from the above that the thermal resistance of the package equipped with a heat sink that has a plurality of flat trapezoidal plates arranged in a row, with each trapezoidal plate having the bottom side shorter than the top side, is smaller than that of the conventional package equipped with a heat sink which has a plurality of rectangular plates of the same size and same shape arranged in a row.

Although aluminum is used as a material for the heat sink in this embodiment, the material is not limited to this particular metal, but may apparently be any material with good thermal conductivity to sufficiently achieve the effect of the present invention.

As described above, since the present invention can suppress temperature rises of a chip and a ceramic package caused by the heat generated when power is supplied to the package, it is possible to provide a high-speed and highly reliable package.

What is claimed is:

1. A heat-sink equipped semiconductor package comprising:
   a case accommodating a chip;
   a heat sink;
   a cavity retaining said chip therein;
   a chip-mount plate; and
   a cap,
   wherein said cavity is sealed with said chip-mount plate and said cap,
   said chip being securely adhered to the bottom surface of said chip-mount plate, and
   said heat sink including a plurality of plates secured and arranged in parallel over said chip-mount plate,
   the outermost plates located at both ends having a rectangular shape, while each of those plates located therebetween being of a trapezoidal shape having a bottom side shorter than a top side, with said bottom side being nearer to said chip-mount plate to allow ease of air flow near the bottom portion of the plates located between said outermost plates.

* * * * *